United States Patent
Govig et al.

(10) Patent No.: US 8,141,015 B1
(45) Date of Patent: Mar. 20, 2012

(54) REPORTING STATUS OF TIMING EXCEPTIONS

(75) Inventors: Jason Govig, San Jose, CA (US); Sami Ahmad Abu-El-Haija, Coralville, IA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/716,234

(22) Filed: Mar. 2, 2010

(51) Int. Cl.
*G06F 17/50* (2006.01)

(52) U.S. Cl. ........................................ 716/108

(58) Field of Classification Search ............... 716/1, 6, 716/108
See application file for complete search history.

(56) References Cited

U.S. PATENT DOCUMENTS

| | | | |
|---|---|---|---|
| 6,493,864 B1 * | 12/2002 | Liu | 716/108 |
| 7,584,443 B1 * | 9/2009 | Govig et al. | 716/113 |
| 7,818,700 B2 * | 10/2010 | Muller-Brahms | 716/123 |
| 2004/0210861 A1 * | 10/2004 | Kucukcakar et al. | 716/6 |
| 2007/0011527 A1 * | 1/2007 | Goswami et al. | 714/726 |
| 2008/0098271 A1 * | 4/2008 | Muller-Brahms | 714/738 |
| 2008/0201671 A1 * | 8/2008 | Rejouan et al. | 716/6 |
| 2008/0263342 A1 * | 10/2008 | Knowles et al. | 712/244 |
| 2009/0327986 A1 * | 12/2009 | Goswami et al. | 716/6 |

* cited by examiner

*Primary Examiner* — Suchin Parihar
(74) *Attorney, Agent, or Firm* — Martine Penilla & Gencarella, LLP

(57) ABSTRACT

A method for reporting timing exception status is presented. The method begins by computing a set of edges of a sub-domain and a set of edges of a timing exception. A slack value is computed based on either the edges of the sub-domain common to the set of edges of the timing exception or the timing paths of the sub-domain. If the sub-domain has a valid slack value, the method compares the sub-domain timing exception type to the timing exception type of the timing exception. The method identifies the timing exception as being overridden if both timing exception types are different and either the slack value computed based on edges of the sub-domain is valid, or the sub-domain has the valid slack value and an intersection of the set of edges of the sub-domain and of the timing exception forms a timing path. The method presents the overridden timing exceptions.

20 Claims, 5 Drawing Sheets

REPORTING STATUS OF TIMING EXCEPTIONS

CROSS REFERENCE TO RELATED APPLICATIONS

This application is related to U.S. patent application Ser. No. 11/683,388, filed Mar. 7, 2007 and entitled, "CLOCK DOMAIN CONFLICT ANALYSIS FOR TIMING GRAPHS"; and U.S. patent application Ser. No. 12/251,002, filed on Oct. 14, 2008, and entitled "DETERMINATION OF MOST CRITICAL TIMING PATHS IN DIGITAL CIRCUITS", all of which are incorporated herein by reference.

BACKGROUND

A significant component of timing analysis involves the use of timing exceptions. A timing exception is a constraint that relaxes or tightens a timing relationship and the common forms of timing exceptions are multi-cycle paths, false paths, and minimum/maximum delay paths. In addition, timing exceptions can be assigned to/from clock domains (all registers or ports clocked by given clock), to/from individual ports or registers, through a given set of nodes, or any combination of these. For example, a register-to-register transfer can be relaxed to allow data to be captured in two clock cycles instead of one. This type of timing exception is commonly called a multi-cycle 2 exception, where "2" signifies the number of allowed clock cycles. The false path (or cut path) timing exception removes the path from the timing analysis, and can be treated as a multi-cycle exception with infinite cycles to capture data.

In many cases, a user can tailor timing exceptions to quickly constrain large groups of timing paths. This tailoring of timing exceptions, along with the use of wildcards and lists, makes it easy for timing exceptions to be applied to a large number of timing paths. The drawback of the ability to tailor timing exceptions is an increased likelihood of unintentionally applying the timing exception to extra paths. Therefore, it is often difficult to determine if a user over-constrained a design or if some timing exceptions erroneously override other timing exceptions. When timing exceptions are applied to a design, information of interest is whether the proper paths were constrained, no additional paths were constrained, or the timing exceptions were not incorrectly overridden by other timing exceptions.

It is in this context that embodiments of the invention arise.

SUMMARY

Broadly speaking, the present invention fills these needs by providing a method and apparatus for reporting the status of timing exceptions. It should be appreciated that the present invention can be implemented in numerous ways, including as a method, a system, or a device. Several inventive embodiments of the present invention are described below.

In accordance with one aspect of the invention, a method for reporting timing exception status is detailed. The method begins by computing a set of edges of a sub-domain and a set of edges of a timing exception. A slack value is computed based on the edges of the sub-domain common to the set of edges of the timing exception or the timing paths of the sub-domain. If the sub-domain has a valid slack value, the method compares the sub-domain timing exception type of the sub-domain to the timing exception type of the timing exception. In one embodiment, the sub-domain timing exception type and the timing exception type is either a default, multi-cycle, or false path. When the sub-domain timing exception type is different than the timing exception type and the slack value computed based on edges of the sub-domain common to the set of edges of the timing exception is valid, or the intersection of the set of edges of the sub-domain and the set of edges of the timing exception forms a timing path and the sub-domain has the valid slack value, the method identifies the timing exception as being overridden. The method then presents the timing exceptions that are identified as being overridden.

In accordance with another aspect of the invention, a method for reporting the status of timing exceptions for timing paths of a timing graph is provided. The method begins by computing a set of edges for a first and a second timing exception. Then the method computes an intersection between the edges of the first timing exception and the second timing exception and then determines if the intersection includes a timing path. If the intersection of the edges of the first and second timing exception includes a timing path, the method identifies the first timing exception as being overridden by the second timing exception, and presents the result.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for reporting the status of timing exceptions. It will be obvious, however, to one skilled in the art, that the present invention may be practiced without some or all of these specific details. In other instances, well known process operations have not been described in detail in order not to unnecessarily obscure the present invention.

Figure 1:
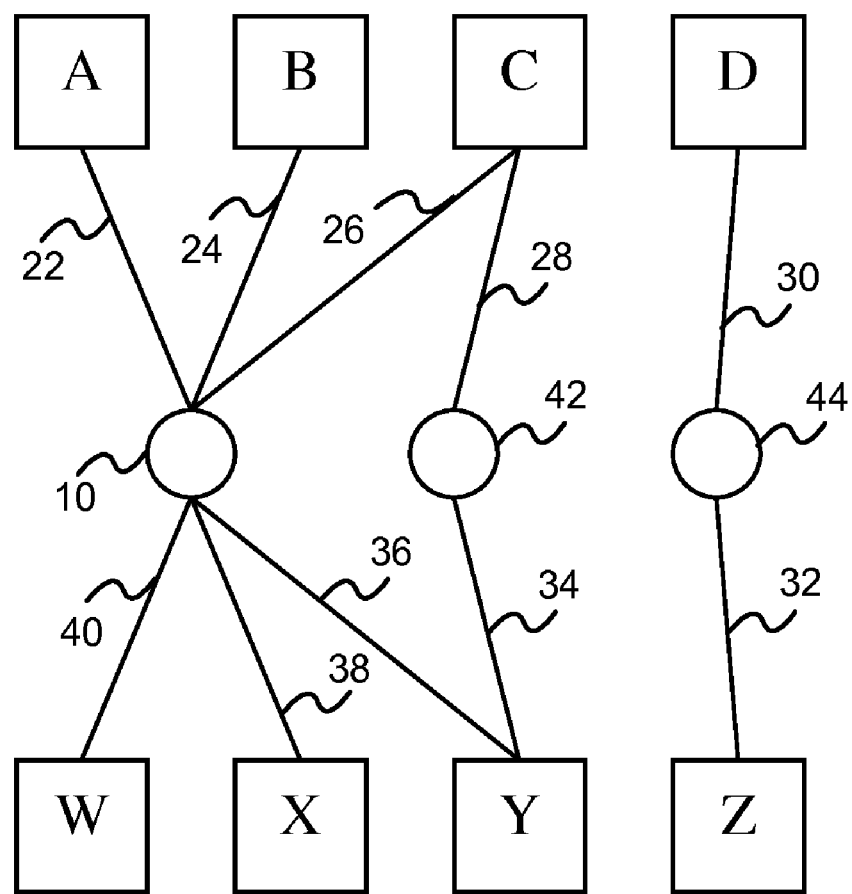
FIG. 1 illustrates a timing diagram illustrating the timing paths between source and destination nodes, in accordance with one embodiment of the present invention.

FIG. 1 illustrates a timing diagram illustrating the timing paths between source and destination nodes, in accordance with one embodiment of the present invention. A timing graph 20 is based upon information in a netlist and captures the timing paths over which signals may propagate and satisfy the timing requirements of the design. For example, timing graph 20 includes a number of nodes A, B, C, D, W, X, Y and Z, as well as edges 22-40 that represent conductors, such as wires. Nodes A, B, C, and D represent source nodes from which a signal will be generated and nodes W, X, Y, and Z represent destination nodes to which a signal will propagate from one or more of source nodes A, B, C, and D. A timing path is a set of edges 22-40 where a signal can be propagated from the source node A, B, C, and D to the destination node W, X, Y, and Z. In one embodiment, the source nodes A, B, C, and D and destination nodes W, X, Y, and Z are registers. Combinational nodes 10, 42, and 44 represent other circuit nodes of a design that are neither a source node A, B, C, and D nor a destination node W, X, Y, and Z and can also be referred to generically as a node. It will be appreciated that multiple paths exist along which a signal may propagate between source nodes A, B, C, and D and destination nodes W, X, Y, and Z. During timing analysis, each of the timing exceptions is analyzed to identify edges 22-40 and combinational nodes 10, 42, and 44 through which a signal may propagate while satisfying the timing requirements defined by the timing exceptions.

A timing exception can be denoted in terms of the source nodes A, B, C, or D, and the destination nodes W, X, Y, or Z. For example, the default timing exception that covers all the timing paths, i.e., the timing paths between source nodes A, B, C, and D and destination nodes W, X, Y, and Z, can be noted as Default: {A, B, C, D} to {W, X, Y, Z}. When timing exceptions are specified by a user, the timing exceptions are processed to form sub-domains with non-overlapping timing paths to improve timing analysis efficiency. For example, assuming the user specifies a multi-cycle timing exception from source node A to destination nodes X and Y. The result is the timing exception processing methodology fractures the default exception, into two default sub-domains, since the user specified multi-cycle timing exception overlaps some of the timing paths of the default timing exception that begin at source node A.

The first default sub-domain, i.e., default1, covers the timing paths that do not overlap the added multi-cycle timing exception. That is the first default sub-domain includes all the source nodes, except source node A. The second default sub-domain, default2, covers the timing paths that have source node A, but does not include destination nodes X and Y, that are specified in the added multi-cycle timing exception. Therefore, the result of adding the multi-cycle timing exception is three sub-domains, two sub-domains for the default analysis and another sub-domain for the newly added multi-cycle timing exception. It should be appreciated that the added multi-cycle timing exception is partially overriding the original default timing exception. In other words, the multi-cycle timing exception is applied to the timing paths between source node A and destination nodes X and Y, in place of the original default timing exception. An exemplary listing of the sub-domains could look like:
Default 1: {B, C, D} to {W, X, Y, Z}
Default 2: {A} to {W, Z}
Multi-cycle: {A} to {X, Y}

If the user further adds a false path timing exception from source node A to destination node X, it should be appreciated the false path timing exception, False path: {A} to {X}, has an overlap with the multi-cycle timing exception, Multi-cycle: {A} to {X, Y}, between source node A and destination node X. In other words, the newly added false path timing exception partially overrides the multi-cycle timing exception. The updated exemplary listing of the sub-domains could look like:
Default 1: {B, C, D} to {W, X, Y, Z}
Default 2: {A} to {W, Z}
Multi-cycle: {A} to {Y}
False path: {A} to {X}

The present invention enables identification of timing exceptions that have been overridden by one or more timing exceptions. In one embodiment, as a user adds timing exceptions it becomes difficult to track if any of the added timing exceptions will unintentionally override another timing exception. In another embodiment, as a user adds timing exceptions, it becomes more difficult to determine the timing exceptions are correctly applied to the intended timing paths. Embodiments described below address these issues of verifying the status of timing exceptions.

Figure 2:
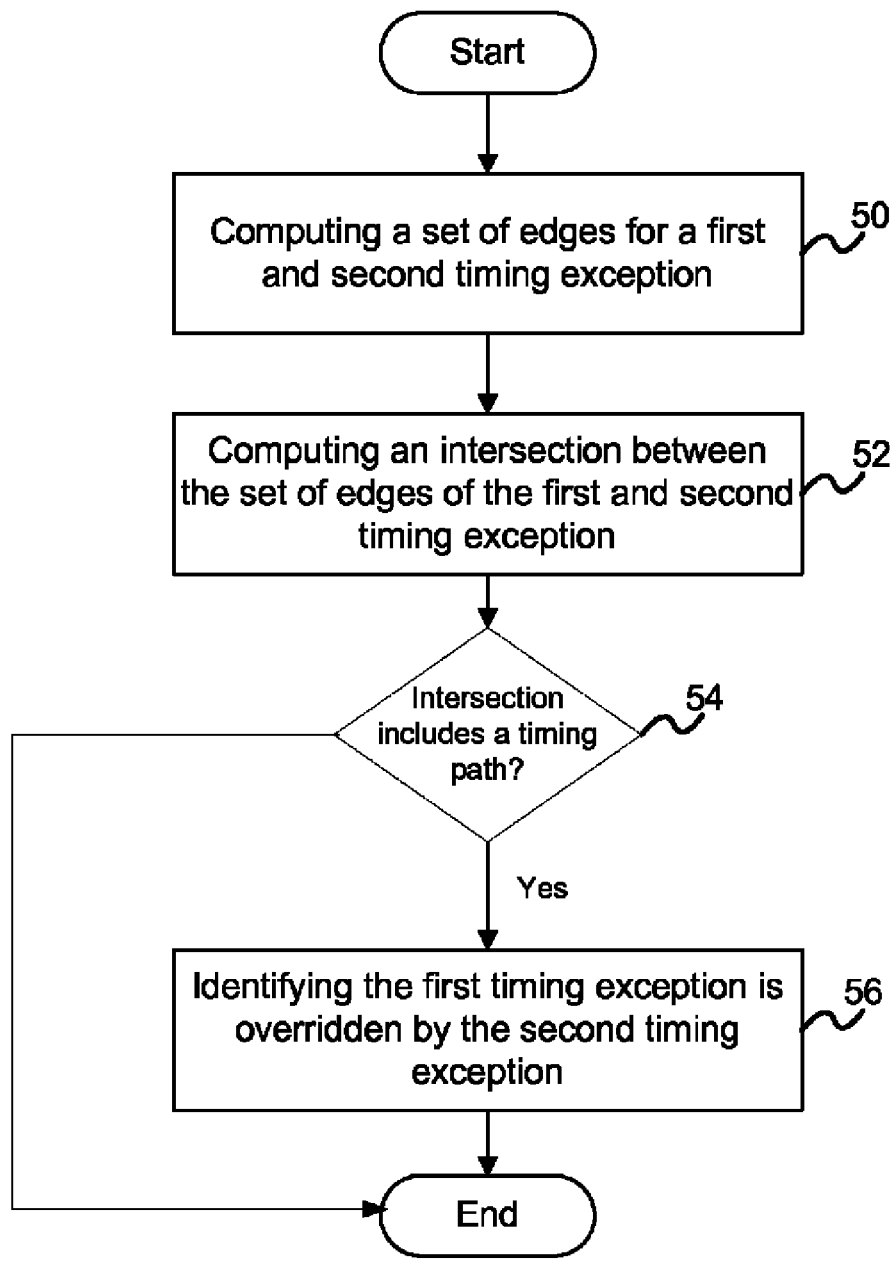
FIG. 2 illustrates the method operations involved in pair-wise reporting of timing exception status, in accordance with one embodiment of the present invention.

FIG. 2 illustrates the method operations involved in pair-wise reporting of timing exception status, in accordance with one embodiment of the present invention. The method can report which timing exception either partially or fully overrode another timing exception by checking if there are any timing paths in common between pairs of timing exceptions. The method begins with operation 50 where a set of edges for both a first and second timing exception are computed. For example, assume the first timing exception is a Multi-cycle: {A} to {X, Y} and the second timing exception is the False path: {A} to {X} as discussed above. Referring to FIG. 1, the set of edges of the first timing exception is edges 22, 36, and 38. Similarly, the set of edges for the second timing exception is edges 22 and 38.

In operation 52, an intersection between the set of edges of the first timing exception and the second timing exception is computed. Using the example above, the intersection of the set of edges between the first and the second timing exception is edges 22 and 38, as illustrated in FIG. 1. The method advances to operation 54, where the method computes if the intersection of the set of edges between the first and second timing exception includes a timing path. It should be appreciated that a timing path is a sequence of adjacent edges that connect a source node to a destination node. Thus, in addition to testing that the intersection contains edges, the intersection should also include a sequence of edges that connect a source node to a destination node, i.e., makes a complete timing path. Operation 56 identifies the first timing exception is overridden by the second timing exception if the intersection includes a timing path. In the current example, referring back to FIG. 2, the set of edges 22 and 38 of the intersection forms a timing path between source element A and destination element X. As a result, the method would identify that the multi-cycle timing exception is being overridden by the false path timing exception. In one embodiment, operations 50-56 are repeated for each pair of timing exceptions.

Additional analysis of the intersection of the set of edges performed in operation 52 enables further information to be provided about the relationship between the first and second timing exception. In the case where the set of edges of the first timing exception is a subset of the intersection of the set of edges of the first and second timing exception, the first timing exception is fully overridden by the second timing exception. If there exists a timing path in the set of edges of the intersection and the set of edges of the first timing exception is not a subset of the set of edges of the intersection, then the first timing exception is partially overridden by the second timing exception. Using the previous example, the set of edges of the first timing exception is edges 22, 36, and 38, while the set of edges of the intersection consists of edges 22 and 38. Since the set of edges of the first timing exception is not a subset of the set of edges of the intersection, i.e., not all the edges of the first timing exception are contained in the set of edges of the intersection, it can be concluded that the multi-cycle timing exception is partially overridden by the false path timing exception. In the case where the set of edges of the first timing exception has no intersection with any timing exception, the first timing exception can be reported as being complete. It should be appreciated that any of several methods can be used to analyze the set of edges of a timing graph, such marking edges with an edge mask. Further details on marking edges with an edge mask may be found in U.S. patent application Ser. No. 11/683,388 entitled "Clock Domain Analysis for Timing Graphs," which has been incorporated by reference for all purposes.

In one embodiment, the timing exceptions are sorted from lowest priority to highest priority based on the timing exception type, i.e., ranked from default to multi-cycle to false path. The timing exception type may also include a value corresponding to a number of allowed clock cycles for data to be captured in multi-cycle timing exceptions, e.g., multi-cycle 2, or a delay value for delay timing exceptions, e.g., 12 ns. In another embodiment, the method is applied to each timing exception and compared with each higher priority timing exception. An exemplary pseudocode implementation of the method of FIG. 2 is shown below.

Foreach exception Ui in U1 . . . Un:
   EI=set of edges defined by Ui
   Foreach exception Ui in Ui . . . Un:
   EJ=set of edges defined by Uj
   E=EI∩EJ
   If E has paths:
     If EI ⊂ E:
       Report Ui as fully overridden (by Uj)
     Else:
       Report Ui as partially overridden by Uj
   If no exceptions overrode Ui:
   Report Ui as complete Timing exceptions are often merged into sub-domains for improved memory efficiency when performing timing analysis. Any of several methods can be used to merge timing exceptions of similar timing exception type (e.g. multi-cycle 1, multi-cycle 2, false path, etc.). One method of merging timing exceptions is on the basis of common source or destination nodes. For example, a multi-cycle timing exception from source node A to destination nodes W and X, and a multi-cycle timing exception from source node A to destination node Y could be merged. The result of the merging is a sub-domain that applies to source node A to destination nodes W, X, Y, as illustrated in FIG. 1.

Another method of merging timing exceptions is on the basis of non-intersecting timing paths. For instance, a multi-cycle timing exception applied to timing paths between source node C to destination node Y, and another multi-cycle timing exception applied to timing paths between source node D to destination node Z could be merged. Because none of the timing paths in the original multi-cycle timing exceptions intersect, i.e., there are no paths from C to Z or from D to Y, as illustrated in FIG. 1, a sub-domain is formed that applies to the timing paths between source nodes C and D to destination nodes Y and Z. It should be noted that after merging timing exceptions into sub-domains, each sub-domain has non-overlapping timing paths with the other sub-domains in the exception group, i.e., none of the sub-domains have a common timing path. One consequence of merging timing exceptions into sub-domains is it becomes difficult to track precisely if any timing exception overrides another timing exception within the sub-domain. Also, it is difficult for a user to know if a timing exception within a sub-domain is partially overridden, fully overridden, or not overridden at all, i.e., complete. Embodiments described below address the difficulty of reporting the status of a timing exception to the user.

Figure 3:
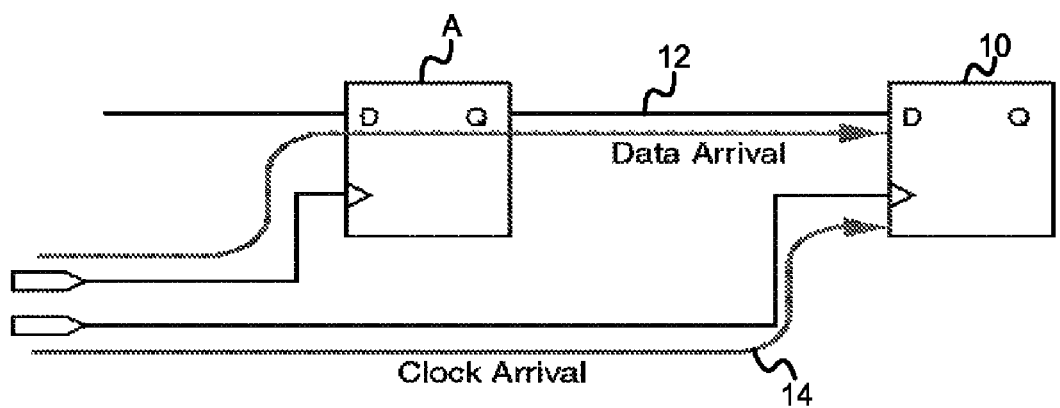
FIG. 3 illustrates a simplified circuit diagram data arrival and clock arrival paths for calculating slack values that are used to report timing status, in accordance with one embodiment of the present invention.

FIG. 3 illustrates a simplified circuit diagram data arrival and clock arrival paths for calculating slack values that are used to report timing status, in accordance with one embodiment of the present invention. Slack computation in its simplest form is determined by computing data arrival times and required data arrival times at each edge or node in the timing graph. The data arrival time 12 is the time in which data is calculated to arrive at a node 10 from a source node A, and the required data arrival time is the time that data is required to arrive at a node for proper circuit operation based on when a clock signal 14 arrives at the node 10. The slack is the difference between the data arrival time 12 and the required data arrival time determined by the incoming clock signal 14. A positive slack value indicates the design is meeting the timing requirements, while a negative slack indicates the design is failing the timing requirement.

Referring to FIG. 2, the method of reporting timing exception status is based on pair-wise comparison of timing exceptions that are not merged. One method of analyzing merged timing exception is done using sub-domains. To report the status of timing exceptions, i.e., if they have been partially or fully overridden, the slack value is computed for all sub-domains, and compared to the timing paths defined by the original timing exception. Embodiments below describe methods for using slack calculations and a determination of whether a sub-domain is associated with an original timing exception as the basis for reporting timing exception status. These methods can further be used to report which timing exceptions have been partially or fully overridden by other timing exceptions. A sub-domain is associated with an original timing exception if its timing exception group is a least partly based on the original timing exception, i.e., the sub-domain timing exception type is the same as the timing exception type, and value for multi-cycle or delay timing exceptions, and at least one timing path in common with the original timing exception.

Figure 4:
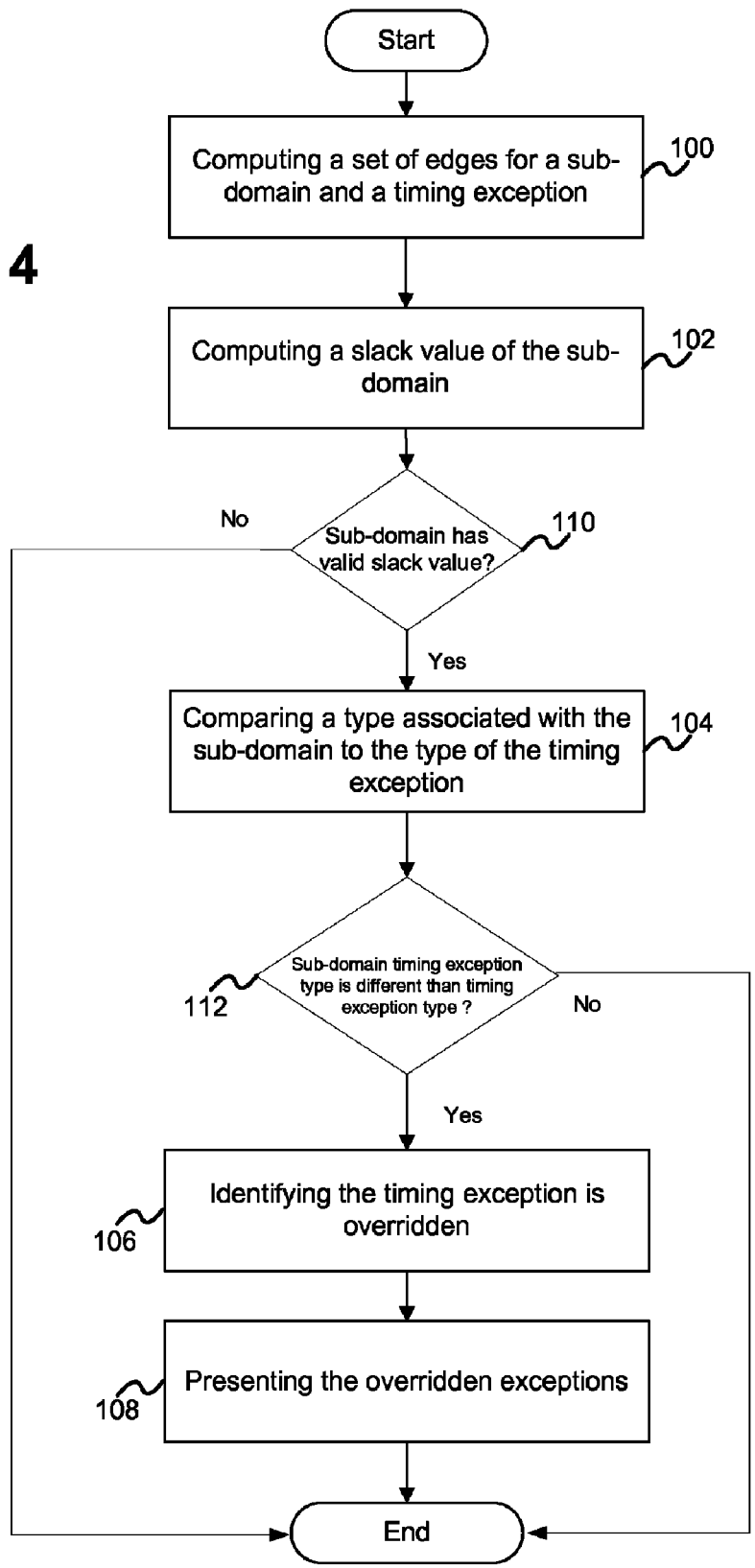
FIG. 4 illustrates the method operations involved in reporting timing exception status of sub-domains using slack calculations, in accordance with one embodiment of the present invention.

FIG. 4 illustrates the method operations involved in reporting timing exception status of sub-domains using slack calculations, in accordance with one embodiment of the present invention. As discussed previously, timing paths associated with false paths timing exceptions are typically removed from standard timing analysis. However, since the method for reporting timing status of sub-domains is based on evaluating slack values, the method tracks false path exceptions in similar fashion as multi-cycle paths or other timing exceptions, i.e., they produce a valid sub-domain. Slack values for false path sub-domains are then computed as if the sub-domain were not a false path, thus producing slack values for false-path sub-domains. This false path analysis provides data to determine when another timing exception is overridden by a false path timing exception.

The method compares a list of timing exceptions with a group of sub-domains. In one embodiment, the timing exceptions that are analyzed by the method are specified by the user. The method begins with operation 100, where a set of edges for the timing exception and the sub-domain are computed. For example, referring to FIG. 1, a false path sub-domain, False path: {A} to {X}, can be compared to a multi-cycle timing exception, Multi-cycle: {A} to {X, Y}. The set of timing paths for the false path sub-domain is {A} to {X}, i.e., the timing path consisting of edges 22 and 38, and the set of timing paths of the multi-cycle timing exception is {A} to {X}, i.e. edges 22 and 38, and {A} to {Y}, i.e. edges 22 and 36.

In operation 102, a slack value of the sub-domain is computed. The slack value of the sub-domain is computed from the difference in the data arrival time and the time the data is required, as illustrated by FIG. 3. In one embodiment, the slack value computation of the false path sub-domain is restricted to the edges of the multi-cycle timing exception that are common to the edges of the false path sub-domain. In the above example, the slack value computation would be performed on edges 22 and 38, which are common to both the multi-cycle timing exception and the false path sub-domain. If the slack value computed based on the edges of sub-domain common with set of edges of the multi-cycle timing exception is valid 110, the valid slack value indicates there is a timing path in common between the false path sub-domain and the multi-cycle timing exception.

In another embodiment, the slack value is computed for all the timing paths of the sub-domain. If the sub-domain has a valid slack value 110, operation 102 further compares the set of edges of the sub-domain to a set of edges associated with a timing exception as computed in operation 100 to determine if there is a timing path in the edges in common between the timing exception and the sub-domain. For example, the slack value is computed for the edges of the false path sub-domain 22 and 38, as discussed above. Since these edges of the false sub-domain would return a valid slack value, the edges of the false path sub-domain are compared to the multi-cycle timing exception with edges 22, 36, and 38. As discussed above, the intersection of these edges is a timing path 22 and 38.

The method advances to operation 104, where the sub-domain timing exception type is compared to the timing exception type. Continuing the above example, the sub-domain timing exception type is false path and the timing exception type is multi-cycle. Therefore, the sub-domain timing exception type differs from the timing exception type. Operation 106 identifies the timing exception is overridden if certain conditions are met. In one embodiment, the timing exception is identified as being overridden if the timing exception and the sub-domain is not associated with the timing exception. In other words, the sub-domain is not associated with the timing exception if at least one timing path of the sub-domain is common to the timing exception, as determined in the slack value computation of operation 102, and if the sub-domain timing exception type is different than the timing exception type 112. Continuing the above example and in reference to FIG. 1, the timing path of the sub-domain of False path: {A} to {X} and the timing exception Multi-cycle: {A} to {X, Y} share the timing path {A} to {X}, i.e., edges 22 and 38, as identified in operation 102. In addition, as identified in operation 104, the sub-domain timing exception type is different than the timing exception type, i.e., false path vs. multi-cycle. Therefore, the multi-cycle timing exception would be identified as being overridden. In one embodiment, the operations 100-106 are repeated for remaining timing exceptions. Operation 108 presents the overridden timing exceptions to the user. An exemplary pseudocode implementation of the method of FIG. 4 is shown below, where "Compute-Slack(S, E)" is the routine that computes the slack value of the sub-domain restricted to the edges of the timing exception, as discussed above in operation 102.

Foreach user exception X:
   E=set of edges defined by X
   num_valid=0
   num_overridding=0
   Foreach sub-domain S:
   Compute-Slack(S, E)
   If valid slack:
     If S is associated with X:
       num_valid+=1
     Else:
       num_overridding+=1
   If (num_overridding>0):
   If (num_valid==0):
     Report X as fully overridden
   Else:
     Report X as partially overridden
   Else:
   If (num_valid==0):
     Report X has no paths
   Else:
     Report X is complete (not overridden)

Further information on the relationship between the sub-domain and the timing exception can be obtained through more detailed analysis. For timing exceptions that are overridden, the timing exception can be further identified as being partially overridden or fully overridden. If none of the sub-domains are associated with the timing exception, i.e., all timing paths of the timing exception are common to sub-domains with different type or value than the timing exception, then the timing exception is identified as being fully overridden. If at least one sub-domain is associated with the timing exception, i.e. a sub-domain and the timing exception have at least one timing path in common, and the sub-domain timing exception type and value are the same as the timing exception type and value, then the timing exception is identified as being partially overridden. When the timing exception is not overridden and does not have a valid slack value, the timing exception is presented as having no valid timing paths. In the case where the timing exception has a valid slack value and is not overridden, the timing exception is presented as being complete.

TABLE 1

| Status | Exception |
|---|---|
| Complete | Set_multicycle_path -from {A} -to {X} |
| Partially Overridden | Set_multicycle_path -from {C} -to {W X Y Z} |
| Fully Overridden | Set_multicycle_path -from {B} -to {Y} |
| Complete | Set_false_path -from {B C} -to {X Y} |

An exemplary output is illustrated above in Table 1. The first entry of Table 1 can be interpreted as showing the timing exception of timing exception type multi-cycle from source node A to destination node X is complete, i.e., not overridden by any other timing exception. The second entry can be interpreted as showing the multi-cycle timing exception between source node C to destination nodes W, X, Y, and Z is partially overridden. The third entry can be interpreted as showing the timing exception of timing exception type multi-cycle from source node B to destination node Y is fully overridden. In other words, all timing paths of the timing exception are overridden by one or more other timing exceptions with higher priority, as discussed in reference to FIG. 2.

Since each sub-domain is the result of exception processing where timing exceptions may have been merged, it is not precisely known which timing exceptions overrode other timing exceptions. But the type of the overriding timing exceptions and the possible candidate timing exceptions are known. Using this information, a list of the possible timing exceptions that may have overridden each original, i.e., un-merged, timing exception can be generated.

TABLE 2

[+] set_multicycle_path -from {A* B*} -to {Y Z} is partially overridden
   Candidate: set_multicycle_path -from {B1} -to {Z}
   Candidate: set_multicycle_path -from {B1} -to {W}
[+] set_multicycle_path -from {B1} -to {Z} is complete
[+] set_multicycle_path -from {B1} -to {W} is complete An exemplary output is illustrated above in Table 2. The exemplary output of Table 2 can be interpreted in similar fashion to the exemplary output of Table 1, except Table 2 provides a list of candidate timing exceptions that may have overridden the original timing exception. In the above exemplary output, the two multi-cycle paths from input node B1 were likely merged as part of exception processing. Therefore, it is not necessarily known which of the two multi-cycle exceptions, i.e., {B1}-to {Z} or {B1}-to {W}, overrode the first multi-cycle path that is partially overridden, from source nodes {A* B*} to destination nodes {Y Z}. In one embodiment, all candidate timing exceptions that possibly overrode the timing exception are listed as candidates. Often an experienced user is able to determine which of the candidate timing exceptions overrode the original timing exception. The embodiments below further provide techniques for identifying which timing exceptions overrode other timing exceptions without relying on user experience.

In many situations, it is desirable to report the timing exception status on a smaller, specified portion of the circuit design rather than analyzing the entire integrated circuit design. A modification to the method of FIG. 4 allows the addition of a specified sub-graph that is used to determine an intersection with each timing exception. In one embodiment, the method of FIG. 4 is modified such that the slack value calculation is applied to the set of edges resulting from the intersection of the edges specified in the sub-graph and the edges that form the timing exception. The intersection of edges can be computed using any of several methods including: a set intersection, bitwise AND of a bitmap, a Boolean vector/array, or edge masking techniques. It should be noted the identification performed in operation 106 of FIG. 4 applies to the specified sub-graph, and not necessarily to all the timing paths of the entire timing exception.

Other information associated with the timing exception such as a list of individual timing paths that makes up the sub-domain can be listed and the slack value of each path can also be presented. In one embodiment, when performing timing analysis using a list of original, i.e., un-merged, timing exceptions, the details of the individual paths can be obtained by iterating through each original timing exception and calculating slack values for the timing paths of the sub-domain that are associated with each timing exception, i.e., having the same type and value. In addition, according to one embodiment of the present invention, slack values can be calculated for false path timing exceptions, as discussed in reference to the method of FIG. 4.

TABLE 3

[+] set_multicycle_path -from {A} -to {X Y}
  [+] Path #1: Slack −2.134 From A to X
    (path details)
  [+] Path #2: Slack −2.002 From A to Y
    (path details)
[+] set_false_path -from {B} -to {X}
  [+] Path #1: False Path From B to X
    (path details)

An exemplary output detailing the timing paths and slack values of timing exceptions is illustrated in Table 3. The exemplary output for the timing exception with timing exception type multi-cycle has two timing paths, where the first timing path is from source node A to destination node X, and has a slack value of −2.134. The second timing path of this timing exception is from source element A to destination Y, and has an associated slack value of −2.002. The timing paths and slack values of the timing exception with timing exception type of false path can be interpreted in a similar fashion.

In another embodiment, a unified method that reports the status of timing exceptions, as well as report timing for each exception can be implemented. The unified method modifies the method of FIG. 4 by including the reporting of the slack calculations and details of the timing paths associated with the sub-domain. An exemplary pseudo-code implementation of the unified method is shown below, where "enumerate k-worst paths" and "report k-worst paths" routines calculate and report the slack values and timing path details for each timing exception. Further details on calculating slack values and timing path details for each timing exception may be found in U.S. patent application Ser. No. 12/251,002 entitled "Determination of Most Critical Timing Paths in Digital Circuits," which has been incorporated by reference for all purposes.

Figure 5:
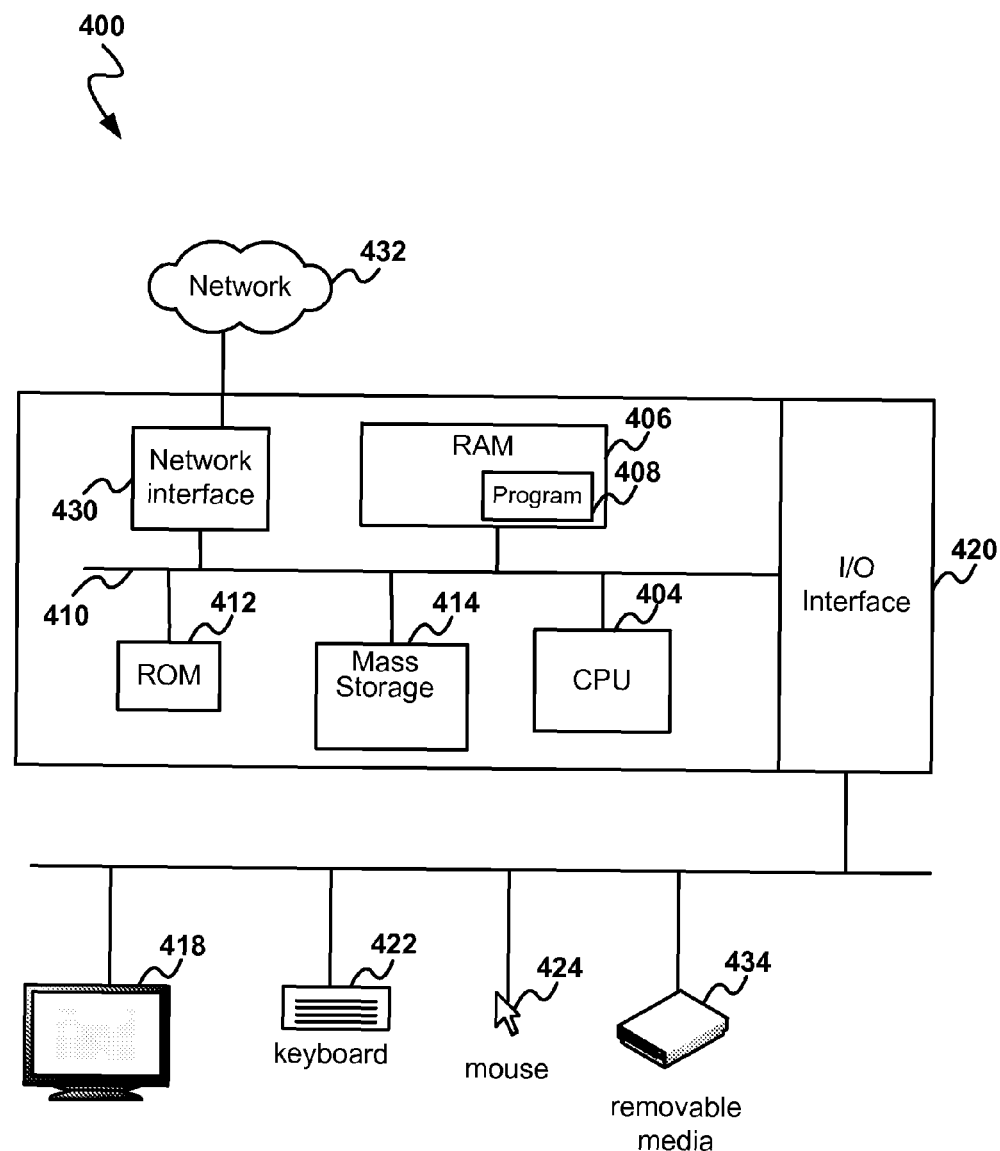
FIG. 5 is a simplified schematic diagram of a computer system for implementing embodiments of the present invention.

Foreach user exception X:
  E=set of edges defined by X
  num_valid=0
  num_overridding=0
  Foreach sub-domain S:
  Compute-Slack(S, E)
  If valid slack:
    If S is associated with X:
      num_valid +=1
      Enumerate k-worst paths
    Else:
      num_overridding +=1
  If (num_overridding>0):
    If (num_valid==0):
      Report X as fully overridden
    Else:
      Report X as partially overridden
  Else:
    If (num_valid==0):
      Report X has no paths
    Else:
      Report X is complete (not overridden)
  Report k-worst paths FIG. 5 is a simplified schematic diagram of a computer system for implementing embodiments of the present invention. It should be appreciated that the methods described herein may be performed with a digital processing system, such as a conventional, general-purpose computer system. Special purpose computers, which are designed or programmed to perform only one function may be used in the alternative. The computer system 400 includes a central processing unit (CPU) 404, which is coupled through bus 410 to random access memory (RAM) 406, read-only memory (ROM) 412, and mass storage device 414. Timing analysis program 408 resides in random access memory (RAM) 406, but can also reside in mass storage 414.

Mass storage device 414 represents a persistent data storage device such as a floppy disc drive or a fixed disc drive, which may be local or remote. Network interface 430 provides connections via network 432, allowing communications with other devices. It should be appreciated that CPU 404 may be embodied in a general-purpose processor, a special purpose processor, or a specially programmed logic device. Input/Output (I/O) interface provides communication with different peripherals and is connected with CPU 404, RAM 406, ROM 412, and mass storage device 414, through bus 410. Sample peripherals include display 418, keyboard 422, cursor control 424, removable media device 434, etc.

Display 418 is configured to display the timing exception status described herein, such as identifying if a timing exception is overridden or complete, providing timing paths of a timing exception, or displaying a slack value of a timing path. In one embodiment, the display 418 can present a visual indicator to identify overridden timing exceptions. In another embodiment, display 418 provides a listing of the status of timing exceptions, as illustrated in Table 1. In yet another embodiment, the display 418 can present information about the slack value and timing paths of a sub-domain using a tree control, where additional details can be optionally presented by expanding or collapsing different sections of the output, as illustrated in Table 3.

Keyboard 422, cursor control 424, removable media device 434, and other peripherals are coupled to I/O interface 420 in order to communicate information in command selections to CPU 404. It should be appreciated that data to and from external devices may be communicated through I/O interface 420. The invention can also be practiced in distributed computing environments where tasks are performed by remote processing devices that are linked through a wire-based or wireless network.

The method and apparatus described herein may be incorporated into any suitable circuit, including processors and programmable logic devices (PLDs). The PLDs can include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by ALTERA CORPORATION.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for reporting timing exception status, the method comprising:

computing a set of edges of a sub-domain and a set of edges of a timing exception, wherein the sub-domain includes merged timing exceptions of similar timing exception type;

computing a slack value based on: (i) the edges of the sub-domain common to the set of edges of the timing exception or (ii) timing paths of the sub-domain, the sub-domain including timing paths between at least one source node and a destination node, the sub-domain associated with a sub-domain timing exception type;

if the sub-domain has a valid slack value,
comparing the sub-domain timing exception type to a timing exception type;
identifying the timing exception as overridden if: (i) the slack value computed based on edges of the sub-domain common to the set of edges of the timing exception is valid and the sub-domain timing exception type is different than the timing exception type, or (ii) the sub-domain has the valid slack value and an intersection of the set of edges of the sub-domain and the set of edges of the timing exception forms a timing path and the sub-domain timing exception type is different than the timing exception type; and presenting the overridden timing exception, wherein at least one method operation is executed by a processor.

2. The method of claim 1, further comprising:

identifying the timing exception as complete if the sub-domain has the valid slack value, all timing paths of the sub-domain are common to the timing paths associated with the timing exception, and the sub-domain timing exception type is equivalent to the timing exception type.

3. The method of claim 1, wherein identifying the timing exception as overridden, further comprises:

if the timing exception is overridden, identifying the timing exception as fully overridden if all timing paths of the sub-domain are common to the timing paths associated with the timing exception; and if the timing exception is overridden, identifying the timing exception as partially overridden if at least one timing path of the sub-domain is different than the timing paths associated with the timing exception.

4. The method of claim 1, further comprising:

identifying that the timing exception lacks valid timing paths if the slack value of the sub-domain is invalid.

5. The method of claim 1, further comprising:

presenting a list of the timing paths associated with each timing exception.

6. The method of claim 1, further comprising:

repeating the method for an additional timing exception so as to report an additional timing exception status.

7. The method of claim 1, wherein computing the slack value, further comprises:

if the sub-domain timing exception type is a false path, then;

computing the slack value of the sub-domain as if the sub-domain timing exception type is a valid path.

8. A non-transitory machine readable storage medium storing instructions thereon, that when executed by a processor implements a method, said method comprising:

receiving a sub-domain representing merged timing exceptions, the sub-domain resulting from a previously processed timing exception;

computing a set of edges of the sub-domain and a set of edges of the timing exception;

computing a slack value for each sub-domain based on: (i) edges of the sub-domain common to the set of edges of the timing exception or (ii) timing paths of the sub-domain;

identifying if the sub-domain is not associated with the timing exception;

identifying the timing exception as overridden if the sub-domain is not associated with the timing exception, the association determined by comparing the sub-domain timing exception type with the timing exception type; and presenting the overridden timing exceptions.

9. The machine readable storage medium of claim 8, wherein the identifying if the sub-domain is not associated with the timing exception further comprises:

comparing a sub-domain timing exception type to a timing exception type; and determining if the sub-domain timing exception type is different than the timing exception type, and one of: i, edges of the sub-domain common to the set of edges of the timing exception sub-domain has the valid slack value, or ii, the sub-domain has the valid slack value, and an intersection of the set of edges of the sub-domain and the set of edges of the timing exception forms at least one timing path.

10. The machine readable storage medium of claim 8, wherein the identifying the timing exception as overridden further comprises:

if the timing exception is overridden, identifying the timing exception as fully overridden if all timing paths of the sub-domain are common to the timing paths associated with the timing exception; and if the timing exception is overridden, identifying the timing exception as partially overridden if at least one timing path of the sub-domain is different than the timing paths associated with the timing exception.

11. The machine readable storage medium of claim 8, wherein the identifying the timing exception is overridden further comprises:

if the timing exception is overridden, presenting a list of other timing exceptions possibly overriding the timing exception.

12. The machine readable storage medium of claim 9, wherein computing the slack value for each sub-domain further comprises:

presenting the slack value for each timing path associated with the timing exception.

13. The machine readable storage medium of claim 8, wherein the computing the slack value for each sub-domain further comprises:

computing the slack value of sub-domains with false paths.

14. The machine readable storage medium of claim 8, wherein the instructions are executed using a command line interface.

15. The machine readable storage medium of claim 8 further comprising:

modifying each timing exception to be an intersection of a plurality of edges defined by the timing exception and a specified plurality of edges.

16. The machine readable storage medium of claim 15, wherein the presenting applies to the specified plurality of edges.

17. A method for reporting the status of timing exceptions for timing paths of a timing graph, the method comprising:

computing a set of edges for a first timing exception and a second timing exception;

computing an intersection between the set of edges of the first timing exception and the second timing exception;

determining if the intersection includes a timing path;

identifying the first timing exception as overridden by the second timing exception if the intersection includes the timing path; and presenting a status of the first timing exception as one of overridden or non-overridden based on whether the set of edges of the first timing exception is a subset of the intersection, wherein at least one method operation is executed by a processor.

18. The method of claim 17 further comprising:

presenting the first timing exception as not overridden if the intersection does not include a timing path; and comparing the set of edges of the first timing exception with a set of edges of the intersection to determine whether the set of edges of the first timing exception is the subset of the intersection.

19. The method of claim 17, wherein reporting the first timing exception is overridden by the second timing exception further comprises:
presenting the first timing exception as fully overridden by the second timing exception if the set of edges for the first timing exception is a subset of the intersection; and
presenting the first timing exception as partially overridden by the second timing exception if the set of edges for the first timing exception is not a subset of the intersection.

20. The method of claim 17, wherein identifying the timing exception as overridden further comprises:
if the first timing exception is overridden, presenting a list of other timing exceptions possibly overriding the first timing exception.

* * * * *